(12) United States Patent
Makino et al.

(10) Patent No.: US 7,345,614 B2
(45) Date of Patent: Mar. 18, 2008

(54) ANALOG TO DIGITAL CONVERTER WITH A SERIES OF INVERTING ELEMENTS

(75) Inventors: Yasuaki Makino, Okazaki (JP); Noboru Endo, Anjo (JP); Takamoto Watanabe, Nagoya (JP); Mitsuharu Kato, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/586,653

(22) Filed: Oct. 26, 2006

(65) Prior Publication Data

US 2007/0103356 A1    May 10, 2007

(30) Foreign Application Priority Data

Nov. 8, 2005    (JP) .............................. 2005-323546

(51) Int. Cl.
*H03M 1/60*    (2006.01)
(52) U.S. Cl. ..................................... 341/157; 341/155
(58) Field of Classification Search ......... 341/150–160
See application file for complete search history.

(56) References Cited

U.S. PATENT DOCUMENTS

| | | | |
|---|---|---|---|
| 5,396,247 A | 3/1995 | Watanabe et al. | |
| 5,502,418 A | 3/1996 | Arai | |
| 5,534,809 A * | 7/1996 | Watanabe et al. | 327/269 |
| 6,255,976 B1 * | 7/2001 | Watanabe et al. | 341/143 |
| 6,307,496 B1 * | 10/2001 | Ikuta et al. | 341/155 |
| 6,329,825 B1 * | 12/2001 | Tanaka et al. | 324/725 |
| 6,940,443 B2 * | 9/2005 | Terazawa et al. | 341/157 |

FOREIGN PATENT DOCUMENTS

| | | |
|---|---|---|
| JP | H05-259907 | 10/1993 |
| JP | H07-283697 | 10/1995 |

* cited by examiner

*Primary Examiner*—Lam T. Mai
(74) *Attorney, Agent, or Firm*—Posz Law Group, PLC

(57) ABSTRACT

An A/D converter has inverting elements and delay elements alternately disposed in series. Each inverting element receives an analog voltage signal as a power source and converts a pulse signal in an inversion operation time depending on the analog voltage signal. Each delay element delays transmission of the pulse signal. The transmission of the pulse signal is started from a starting inverting element at a start time, and a transit position of the pulse signal is detected at a detection time later than the start time by a predetermined time. A digital value indicating a level of the analog voltage signal is determined from the detected transit position of the pulse signal. Because transmission of the pulse signal is delayed by the delay elements, the transit position depending on the analog voltage signal can be correctly detected.

24 Claims, 6 Drawing Sheets

ANALOG TO DIGITAL CONVERTER WITH A SERIES OF INVERTING ELEMENTS

CROSS-REFERENCE TO RELATED APPLICATION

This application is based upon and claims the benefit of priority of the prior Japanese Patent Application 2005-323546 filed on Nov. 8, 2005 so that the contents of which are incorporated herein by reference.

BACKGROUND OF THE INVENTION

1. Field of the Invention

The present invention generally relates to an analog to digital (A/D) converter wherein the number of inverting elements through which a pulse signal is transmitted is changed in dependent on an analog voltage signal to convert the analog voltage signal into a digital value corresponding to the number of inverting elements.

2. Description of Related Art

An A/D converter is, for example, disclosed in Japanese Patent No. 3064644, and a block diagram of this converter is shown in FIG. 1. As shown in FIG. 1, an A/D converter 1 formed as an integrated circuit (IC) chip has a pulse phase difference encoding circuit 2 and a control circuit 4. The circuit 4 periodically generates two control signals PA and PB having a fixed phase difference from each other. The phase difference is defined as a period of time Ts (hereinafter, called sampling time Ts) from a level rise time of the signal PA to a level rise time of the signal PB. The circuit 2 produces digital data indicating an analog value of a voltage by using the signals PA and PB. The circuit 2 has a pulse transit circuit 10, a counter 12, a latch 14, a pulse selector 16, an encoder 18, and a signal processor 19.

The circuit 10 has an odd number of elements composed of an NAND gate 101 and an even number of inverters 102. The number of inverters 102 is, for example, set at 14 in the circuit 10. The gate 101 and the inverters 102 are connected with one another in a ring shape so as to form a ring oscillator. The gate 101 receives the signal PA of the circuit 4 and an output of the inverter 102 disposed at the former stage of the gate 101. When the gate 101 receives the signal PA set at low level, the gate 101 always outputs a high level signal to the gate 101 disposed at the latter stage of the gate 101. Therefore, a signal output from each of the gate 101 and inverters 102 is maintained at a low or high level. In contrast, when the gate 101 receives the signal PA set at high level, the gate 101 outputs a high level signal in response to a low level signal of the former inverter 102 or outputs a low level signal in response to a high level signal of the former inverter 102. Therefore, the gate 101 acts as a starting inverter, and a level of a pulse signal transmitted through the gate 101 and inverters 102 is changed each time the signal passes through the gate 101 or one inverter 102. Further, because the total number of the gate 101 and inverters 102 is odd, each of the gate 101 and inverters 102 changes a level of the pulse signal every reception of the pulse signal. Therefore, in response to a level rise of the signal PA, the gate 101 and inverters 102 starts changing levels of input signals one after another as if a pulse signal starts going around the gate 101 and inverters 102 while changing its level in each of the gate 101 and inverters 102. That is, the pulse signal is repeatedly circulated in the circuit 10 while changing its level at each element, so that the circuit 10 acts as a pulse circulation circuit.

The counter 12 increments a counting number each time a level of an output of the inverter 102 disposed at the former stage of the gate 101 is changed or inverted and outputs first digital data indicating the counting number. The first digital data is expressed by binary digits. The counting number denotes the number of times in the circulation of the pulse signal and is called a circulation number in this specification.

The latch 14 holds an updated first digital data output from the counter 12 and outputs the first digital data when receiving the signal PB set at high level from the circuit 4. Therefore, in response to a level rise of the signal PB, the latch 14 outputs the first digital data to the processor 19. The first digital data indicates the circulation number of the pulse signal within the sampling time Ts.

The selector 16 receives the output signals of the gate 101 and inverters 102, detects a transit position of the pulse signal from the levels of the output signals and outputs a position signal indicating the transit position when receiving the signal PB set at high level from the circuit 4. More specifically, the gate 101 and inverters 102 change levels of those output signals one after another every circulation of the pulse signal. When a first element of the circuit 10 changes the level of the pulse signal at a certain time, this level is the same as that of the output signal of a second element placed just at the latter stage of the first element at this certain time. Therefore, when detecting two signals of the same level from two particular elements adjacent to each other at a detection time, the selector 16 recognizes that the pulse signal is positioned at the particular element placed at the former stage of the other particular element at the detection time. Therefore, the position signal indicates a transit position at which the pulse signal is placed at the detection time. The transit position is indicated by the total number of elements placed between the gate 101 and the particular element. The selector 16 outputs the transit position to the encoder 18 at a detection time the signal PB is changed to a high level.

The encoder 18 produces second digital data from the position signal of the encoder 18 such that the second digital data indicates the transit position at the detection time. The second digital data is expressed by binary digits.

The processor 19 receives the first digital data of the latch 14 and the second digital data of the encoder 18, and produces final digital data DO1 from the first and second digital data such that the final digital data DO1 indicates the number of elements through which the pulse signal passes within the sampling time Ts. More specifically, the number of elements to be indicated by the final digital data DO1 is equal to a sum of the second digital data and a product of the number of elements in the circuit 10 and the circulation number. The processor 19 produces combined digital data from the combination of the second digital data placed at lower bits (for example, four lower bits) of the combined digital data and the first digital data placed at upper bits of the combined digital data by shifting the first digital data by N bits (for example, four bits) to the upper side. Then, to compensate a difference between $2^N$ and the total number of elements in the circuit 10, the processor 19 adds the first digital data to the combined digital data, so that the final digital data DO1 is produced. Therefore, the A/D converter can output the final digital data DO1 indicating the number of elements through which the pulse signal passes within the sampling time Ts.

Further, an analog voltage signal Vin is applied from a terminal 2a to each of the gate 101 and inverters 102 of the circuit 10 as a power source voltage to drive the gate 101 and inverters 102. Each element of the circuit 10 inverts an input signal into an output signal in an inversion operation time Ti which is changed in dependent on a level of the voltage signal Vin. Further, the number of elements through which the pulse signal passes within the sampling time Ts is determined by dividing the sampling time Ts by the inversion operation time Ti. Therefore, the final digital data DO1 is changed in dependent on the time Ti. In other words, the final digital data DO1 corresponding to the voltage signal Vin is obtained in the A/D converter, so that a digital value indicating the level of the signal Vin can be obtained from the data DO1.

Further, because the A/D converter periodically outputs the data DO1 in response to the signals PA and PB of the fixed phase difference, a change in the voltage signal Vin can be indicated by a change in the data DO1. Accordingly, the A/D converter can convert the analog voltage signal Vin changing with time into digital data expressed by binary digits.

However, a transmission speed of a pulse signal in each of the gate 101 and inverters 102 of the circuit 10 is generally very high (for example, 10 ns), so that the pulse transmission speed is easily influenced by wiring delay which is caused by resistances (hereinafter, called wiring resistance) of wires connecting elements with one another, capacitance (hereinafter, called wiring capacitance) of a capacitor formed between each wire and the ground, and parasitic capacitance between the wires disposed through an insulating layer.

As a result, elements (e.g., selector 16) subsequent to the circuit 10 are not sometimes operated as designed, thereby outputting erroneous data.

To design an A/D converter formed as an IC chip, particularly to design a pattern layout of an A/D converter, there are various restrictions in design to reduce the influence of the wiring delay. For example, wires having the same shape as one another are used to connect inverters with one another, and each inverter is formed on a portion of an insulating layer far away from a portion receiving AC coupling. Therefore, design of an A/D converter is complicated, it takes a long time for the design, and only very skillful designers are allowed to design an A/D converter. Further, an A/D converter cannot be manufactured by using a field programmable gate array (FPGA) known as one of widely-used electronic parts.

SUMMARY OF THE INVENTION

An object of the present invention is to provide, with due consideration to the drawbacks of the conventional, an A/D converter wherein arrangement of elements and shape of wires are easily designed so as to correctly convert a level of an analog voltage signal into a digital value.

According to a first aspect of this invention, the object is achieved by the provision of an analog to digital converter comprising a pulse transit unit having a series of inverting elements so as to transmit a pulse signal through the inverting elements such that the pulse signal is inverted in each inverting element in an inversion operation time, a signal input terminal through which an analog voltage signal is applied to each inverting element as a power source voltage, a detecting unit which detects a transit position of the pulse signal in the pulse transit unit, and a control unit which calculates a digital value indicating a level of the analog voltage signal from the detected transit position and outputs the digital value. The pulse transit unit further has a plurality of delay elements so as to alternately dispose the inverting elements and the delay elements.

The control unit controls the pulse transit unit to start the transmission of the pulse signal from a starting inverting element included in the inverting elements at a start time and controls the detecting unit to detect the transit position of the pulse signal at a detection time later than the start time by a predetermined time. Further, the inversion operation time in each inverting element is changed in dependent on a level of the analog voltage signal. Therefore, a transmission speed of the pulse signal in the pulse transit unit is changed in dependent on the analog voltage signal, so that the transit position of the pulse signal is changed in dependent on the analog voltage signal. As a result, the converter converts a level of the analog voltage signal into a digital value by calculating the digital value from the detected transit position.

Further, because the inverting elements and the delay elements are alternately disposed in the pulse transit unit, each delay element delays the transmission of the pulse signal between the inverting elements in the corresponding pair. Therefore, even though the transmission of the pulse signal is unexpectedly delayed due to wiring delay caused by wiring resistance, wiring capacitance, parasitic capacitance and the like, the transit position of the pulse signal can be correctly changed in dependent on the analog voltage signal. Accordingly, arrangement of elements and shape of wires in the pulse transit unit can be easily designed so as to correctly convert an analog voltage signal into a digital value.

According to a second aspect of this invention, in place of the delay elements, the pulse transit unit has a plurality of analog switches so as to alternately dispose the inverting elements and the analog switches. The control unit controls the analog switches such that the pulse signal is twice transmitted through a portion of the inverting elements and analog switches each time the pulse signal is transmitted through all the inverting elements and analog switches.

Because the inverting elements and the analog switches are alternately disposed, the transmission of the pulse signal is inevitably delayed by the analog switches. Accordingly, arrangement of elements and shape of wires in the pulse transit unit can be easily designed.

Further, because the control unit controls the analog switches such that the pulse signal is twice transmitted through the portion of the inverting elements and analog switches each time the pulse signal is transmitted through all the inverting elements and analog switches, this converter can act as a converter having converting elements of which the number is higher than the number of converting elements actually disposed. Accordingly, the converter can be manufactured in a smaller size so as to satisfy resolution required in the converter.

According to a third aspect of this invention, each inverting element of the pulse transit unit has a P-channel transistor and an N-channel transistor serially connected with one another. In place of the delay elements or analog switches, at least one of the transistors of each inverting element is adapted to lower an operation speed of the transistor.

Because an operation speed of the transistor is lower than that of a normal transistor, the transmission of the pulse signal is delayed in each inverting element. Accordingly, arrangement of elements and shape of wires in the pulse transit unit can be easily designed.

DETAILED DESCRIPTION OF THE PREFERRED EMBODIMENTS

Figure 1:
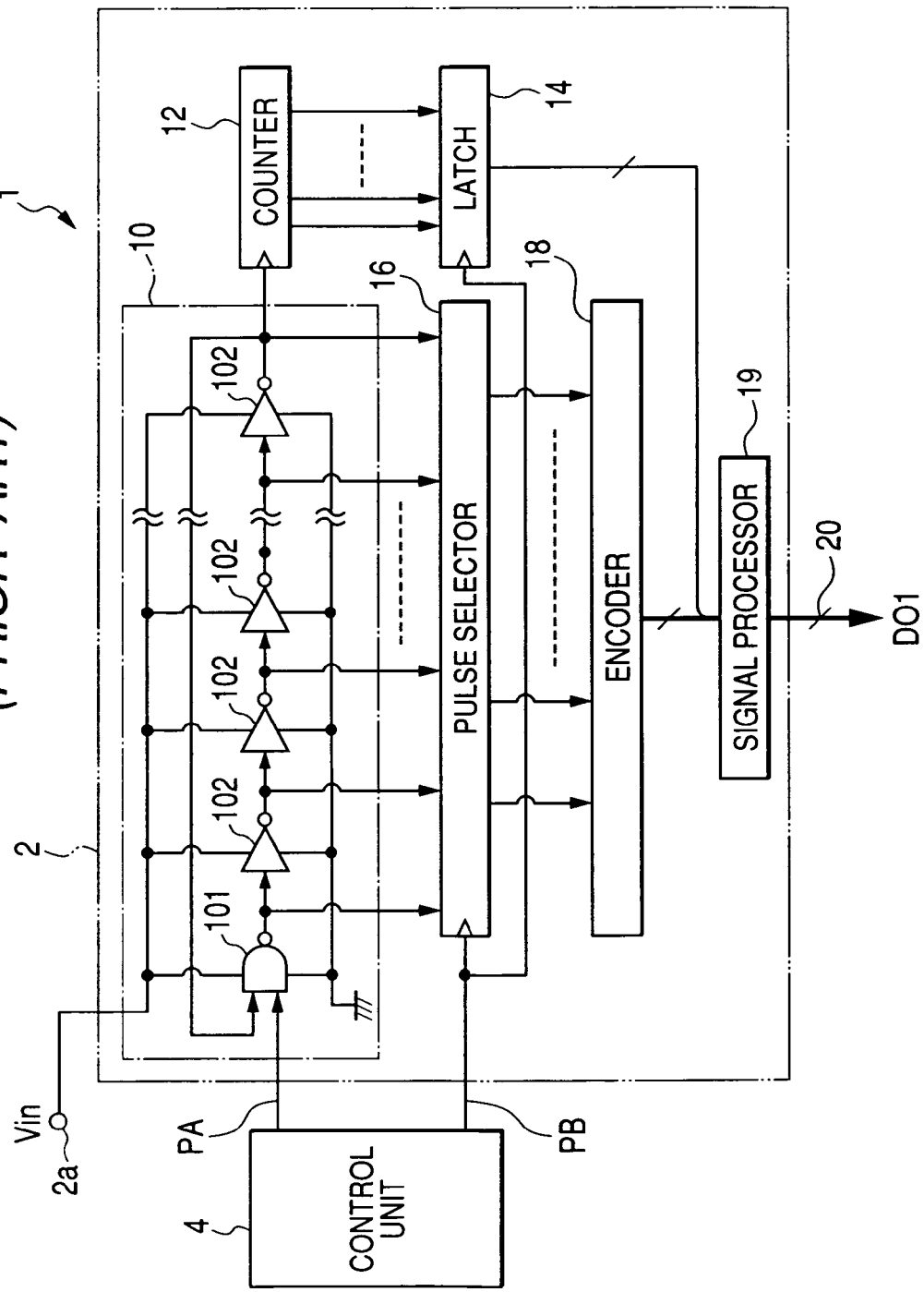
FIG. 1 is a block diagram of an A/D converter according to a prior art.

Embodiments of the present invention will now be described with reference to the accompanying drawings, in which like reference numerals indicate like parts, members or elements throughout the specification unless otherwise indicated. These embodiments should not be construed as limiting the present invention to structures of those embodiments, and the structure of this invention may be combined with that based on the prior art.

Embodiment 1

Figure 2:
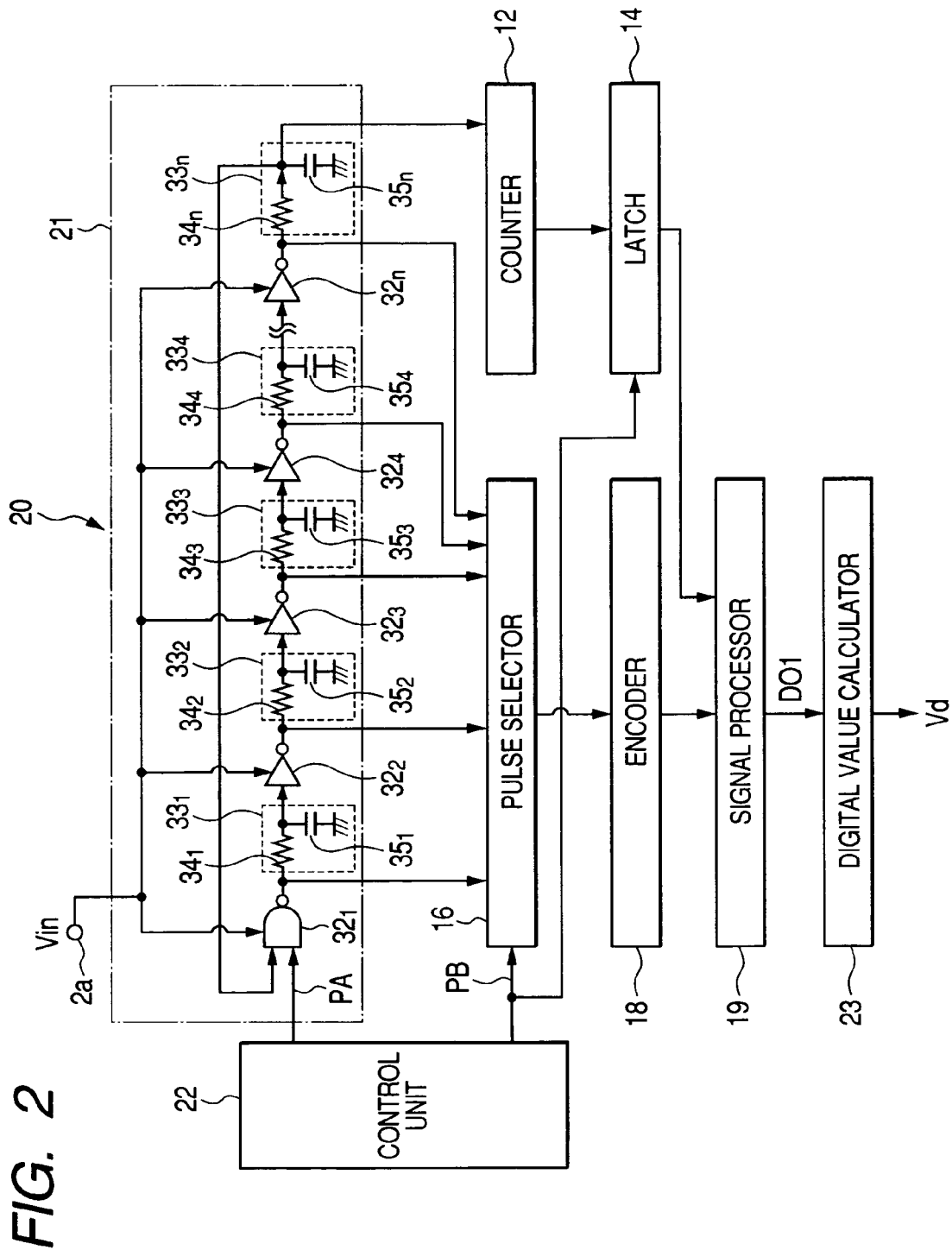
FIG. 2 is a block diagram of an A/D converter according to a first embodiment of the present invention.

FIG. 2 is a block diagram of an A/D converter according to a first embodiment.

As shown in FIG. 2, an A/D converter 20 formed as an integrated circuit (IC) chip has a control unit 22, a pulse transit unit 21, the counter 12, the latch 14, the pulse selector 16, the encoder 18, the signal processor 19 and a digital value calculator 23. The unit 22 periodically generates two control signals PA and PB having a fixed phase difference from each other. This phase difference denotes a sampling time Ts from a level rise time of the signal PA to a level rise time of the signal PB. The unit 21 has an odd number of inverting elements 32 ($32_1$ to $32_n$) ("n" is an odd number higher than 2) and an odd number of delay elements 33 ($33_1$ to $33_n$). The elements 32 includes a starting inverting element $32_1$. The inverting elements 32 and the delay elements 33 are alternately disposed so as to be formed in a ring shape. That is, each delay element $33_i$ ("i" is a natural number higher than 0 and lower than n) is disposed between the inverting element $32_i$ and $32_{i+1}$, and the delay element $33_n$ is disposed between the inverting element $32_n$ and $32_1$. The selector 16 receives an output of each element 32. The counter 12 receives an output of the element $32_n$ through the delay element $33_n$ and increments a counting number each time a level of the output is changed.

The element $32_1$ is formed of an NAND gate, and each of the elements $32_2$ to $32_n$ is formed of an inverter. An analog voltage signal Vin is applied to each element 32 as a power source voltage to drive the element 32. Each element 32 inverts an input pulse signal in an inversion operation time Ti (for example, 10 ns). The time Ti is changed in dependent on a level of the voltage signal Vin. Therefore, this time is expressed by Ti(Vin). When the pulse signal PA set at high level is received at a first input terminal of the element $32_1$, the element $32_1$ converts a pulse signal input at a second input terminal thereof. Each of the elements $32_2$ to $32_n$ always converts an input pulse signal. Therefore, the starting inverting element $32_1$ and the inverting elements $32_2$ to $32_n$ act in the same manner as the gate 101 and the inverters 102 shown in FIG. 1.

Each delay element $33_i$ delays transmission of a signal from the element $32_i$ to the element $32_{i+1}$ by a predetermined delay time Td (for example, 1 μs being hundred times longer than the time Ti), and the delay element $33_n$ delays transmission of a signal from the element $32_n$ to the element $32_1$ by the delay time Td. This delay time Td is set to be considerably larger than the inversion operation time Ti. Therefore, it takes a sum of the delay time Td and the operation time Ti to transmit a signal between the elements 32 in each pair.

Each delay element 33 is, for example, formed of a low pass filter. More specifically, each delay element $33_i$ has a resistor $34_i$ and a capacitor $35_i$, and the delay element $33_n$ has a resistor $34_n$ and a capacitor $35_n$. One end of the resistor $34_i$ is connected with an output terminal of the element $32_i$, and the other end of the resistor $34_i$ is connected with an input terminal of the element $32_{i+1}$. One end of the capacitor $35_i$ is connected with the other end of the resistor $34_i$, and the other end of the capacitor $35_i$ is grounded. In the same manner, one end of the resistor $34_n$ is connected with an output terminal of the element $32_n$, and the other end of the resistor $34_n$ is connected with both a second input terminal of the element $32_1$ and the counter 12. One end of the capacitor $35_n$ is connected with the other end of the resistor $34_n$, and the other end of the capacitor $35_n$ is grounded.

With this configuration of the A/D converter 20, when the control signal PA set at high level is received at the first input terminal of the element $32_1$, the element $32_1$ starts converting a pulse signal input at the second input terminal thereof, and then the elements $32_2$ to $32_n$ converts the pulse signal in that order. Therefore, the pulse signal is transmitted through the inverting elements 32 while being delayed in the delay elements 33. The number Np of inverting elements 32 through which the pulse signal passes within the sampling time Ts is determined by dividing the sampling time Ts by a sum of the inversion operation time Ti(Vin) and the delay time Td. That is, Np=Ts/(Ti(Vin)+Td) is satisfied. Therefore, in the same manner as in the A/D converter shown in FIG. 1, final digital data DO1 indicating the number Np is changed in dependent on the analog voltage signal Vin and is output from the processor 19. The calculator 23 calculates the time Ti (Vin) from the digital data DO1 and converts the time Ti (Vin) into a digital value Vd indicating a level of the voltage Vin. The digital value Vd is, for example, expressed by binary digits. In this conversion, the calculator 23 uses a conversion table indicating a relation between the inversion operation time Ti and a level of the voltage signal Vin. Therefore, a change in the analog voltage signal Vin can be indicated by a change in digital data expressed by binary digits.

Further, although wiring delay in the IC chip is inevitably caused by wiring resistance, wiring capacitance, parasitic capacitance and the like so as to slightly delay a transmission speed of the pulse signal in the unit 21 to an unknown or unexpected degree, each delay element 33 is disposed between the inverting elements 32 so as to considerably delay the transmission speed of the pulse signal as compared with a delay caused by the wiring delay. Therefore, even though the pulse signal is delayed in the pulse transit unit 21 due to the wiring delay, a change in the transmission speed caused by the wiring delay is substantially negligible as compared with a level of the transmission speed mainly determined by the delay elements 33.

Accordingly, because the transmission speed of the pulse signal is hardly influenced by the wiring delay, arrangement of the elements 32 and shape of wires connecting the elements 32 with one another can be easily designed so as to correctly convert the analog voltage signal Vin into a digital value in the A/D converter 20.

Further, the A/D converter 20 can be designed without considering various restrictions in design such as use of wires having the same shape as one another, positioning of the elements 32 so as to be placed far away from portions receiving AC coupling, and the like. Therefore, the design of the A/D converter 20 can be simplified, a period of time required in design can be shortened, and the A/D converter 20 can be manufactured by using one of widely-used electronic parts such as FPGA.

In this embodiment, it is preferred to appropriately set a resistance value of each resistor 34 and a capacitance value of each capacitor 35 by performing actual experiments or simulations while considering the resolution required in the A/D converter 20 or the sampling time Ts. Each resistor 34 is preferably formed of a wire connecting the elements 32 with each other to have a desired wiring resistance, and each capacitor 35 is preferably formed between the wires to have a desired wiring capacitance. In this case, a sectional area and a length in each wire and a distance between wires are set at predetermined values.

Further, the resistors 34 are preferably set at the same resistance value as one another, and the capacitors 35 are preferably set at the same capacitance value as one another. However, the resistors 34 may be set at resistance values different from one another, and the capacitors 35 may be set at capacitance values different from one another.

Moreover, the counter 12 is disposed in the converter 20 to detect the number of times in the circulation of the pulse signal. However, because the transmission speed of the pulse signal is considerably delayed by the delay elements 33, the number of elements 32 through which the pulse signal is transmitted within the sampling time Ts can be lower than the total number N of the elements 32 so as not to circulate the pulse signal in the unit 21. Therefore, the counter 12 and the latch 14 are not necessarily required in the converter 20 by adequately setting both the delay time Td and the sampling time Ts.

Furthermore, the digital value determined from the analog voltage signal Vin is expressed by binary digits in the binary numeration system. However, the numeration system is not limited to this binary numeration system. For example, the digital data may be expressed by decimal digits in a decimal numeration system, octal digits in an octal numeration system, hexadecimal digits in an hexadecimal numeration system, or the like.

Still further, the starting inverting element $32_1$ is formed of the NAND gate. Therefore, it is required to place an even number of inverting elements $32_2$ to $32_n$ in the unit 21. However, the starting inverting element $32_1$ may be formed of another type of gate such as an AND gate, an OR gate, or a NOR gate or the like. In case of the AND gate adopted as the element $32_1$, the number of inverting elements $32_2$ to $32_n$ is set at an odd number. In case of the OR gate, the number of inverting elements $32_2$ to $32_n$ is set at an odd number, and the sampling time Ts is defined as a period of time from a level fall time of the signal PA to a level rise time of the signal PB. In case of the NOR gate, the number of inverting elements $32_2$ to $32_n$ is set at an even number, and the sampling time Ts is defined as a period of time from a level fall time of the signal PA to a level rise time of the signal PB.

Embodiment 2

Figure 3:
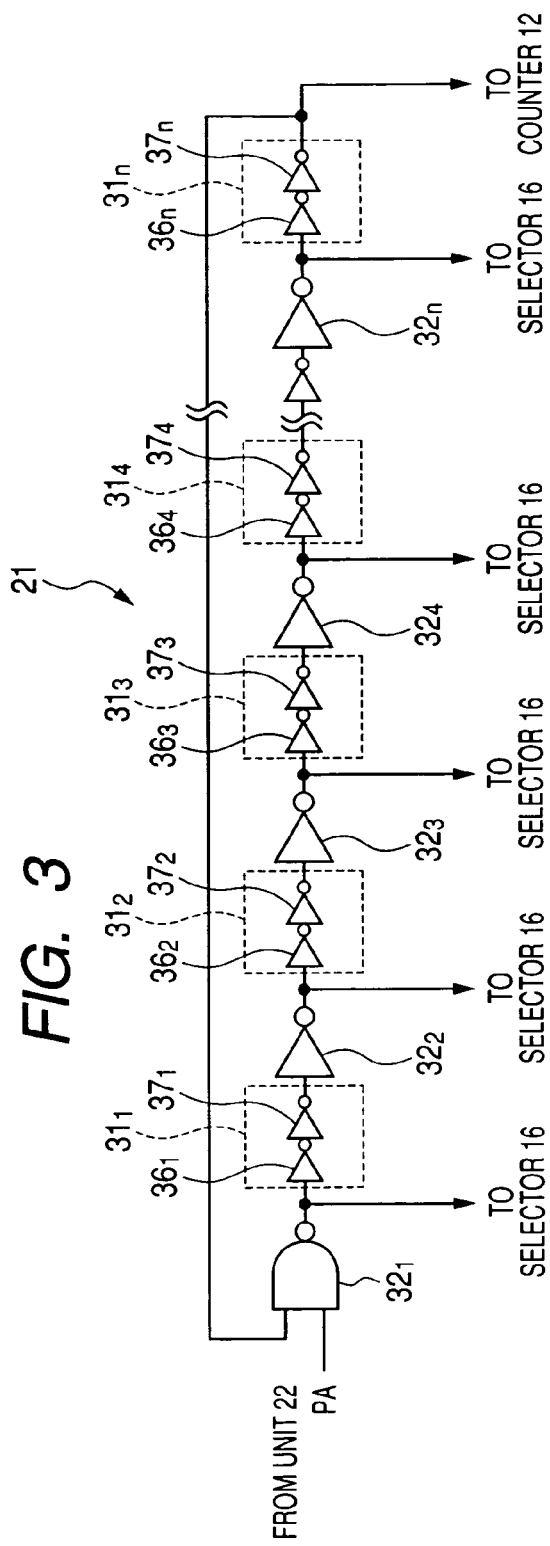
FIG. 3 is a block diagram of a pulse transit unit of an A/D converter according to a second embodiment of the present invention.
Figure 4:
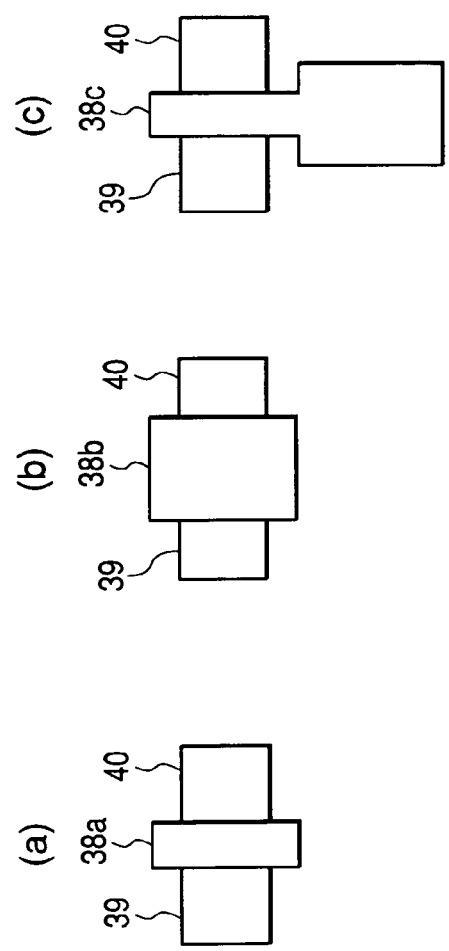
FIG. 4(a) is a schematic plan view of a transistor having a gate set at a normal size.
FIG. 4(b) is a schematic plan view of a transistor having a gate longer than that shown in FIG. 4(a)
FIG. 4(c) is a schematic plan view of a transistor having a gate larger than that shown in FIG. 4(a)

FIG. 3 is a block diagram of a pulse transit unit of an A/D converter according to a second embodiment. FIG. 4(a) shows a transistor having a gate set at a normal size, FIG. 4(b) shows a transistor having a gate longer than that shown in FIG. 4(a), and FIG. 4(c) shows a transistor having a gate larger than that shown in FIG. 4(a).

As shown in FIG. 3, the unit 21 differs from that shown in FIG. 2 in that a plurality of delay elements 31 are disposed in place of the delay elements 33. Each delay element $31_j$ ("j" is a natural number higher than 0 and equal to or lower than n) is formed of a pair of inverters $36_j$ and $37_j$ serially connected with each other. Each of the inverters 36 and 37 has a P-channel metal-oxide-semiconductor field effect transistor (MOS FET) and an N-channel MOS FET serially connected with each other. One of the transistors in each inverter has a gate 38a, a source 39 and a drain 40 shown in FIG. 4(a), and the other transistor has a lengthened gate 38b, the source 39 and the drain 40 shown in FIG. 4(b). The gate 38a has a normal size, and the length of the gate 38b is longer than the gate 38a. As a gate of a transistor is lengthened, an operating speed of the transistor is lowered. Therefore, each delay element 31 can delay the transmission of the pulse signal by the delay time Td by adjusting the length of the gate 38b.

In this embodiment, both gates of the transistors in each inverter may be lengthened so as to delay the transmission of the pulse signal by the delay time Td. Further, as shown in FIG. 4(c), an area or volume of the gate of one transistor in each inverter may be enlarged, or an area or volume of the gate of each transistor in the inverters 36 and 37 may be enlarged. As an area or volume of a gate of a transistor is enlarged, an operating speed of the transistor is lowered.

Further, the number of inverters in each delay element 31 is set at two to cause a signal output from the delay element to become the same level as that of a signal input to the delay element. However, the number of inverters in each delay element 31 may be set at an arbitrary even number.

Moreover, each delay element may be formed of an analog switch. The analog switch has a transistor always set at an on state, and the pulse signal passes through each analog switch. In this case, to adjust the delay time Td, a gate of the transistor of each analog switch is preferably lengthened, or an area or volume of the gate is preferably enlarged.

In the first and second embodiments, each inverting elements 32 is formed of an N-channel MOS FET and a P-channel MOS FET serially connected with each other. A gate of one transistor of each element 32 or a gate of each transistor of the elements 32 may be lengthened to lower an operation speed of the transistor, or an area or volume of a gate in either one transistor of each element 32 or each transistor of the elements 32 may be enlarged to lower an operation speed of the transistor. In this case, because the transmission of the pulse signal in the unit 21 is delayed, no delay elements 31 are required in the unit 21.

Embodiment 3

Figure 5:
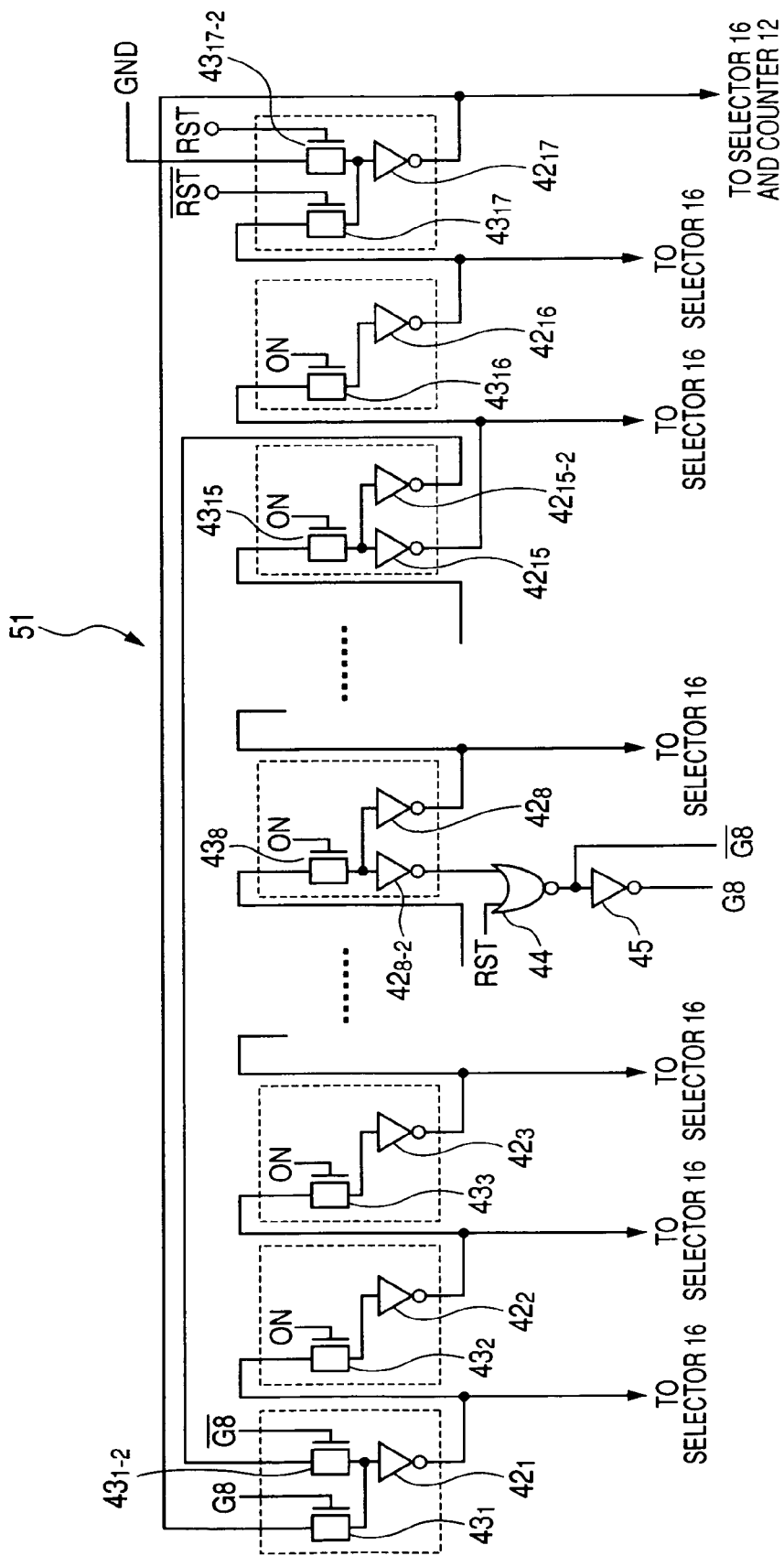
FIG. 5 is a block diagram of a pulse transit unit of an A/D converter according to a third embodiment of the present invention.
Figure 6:
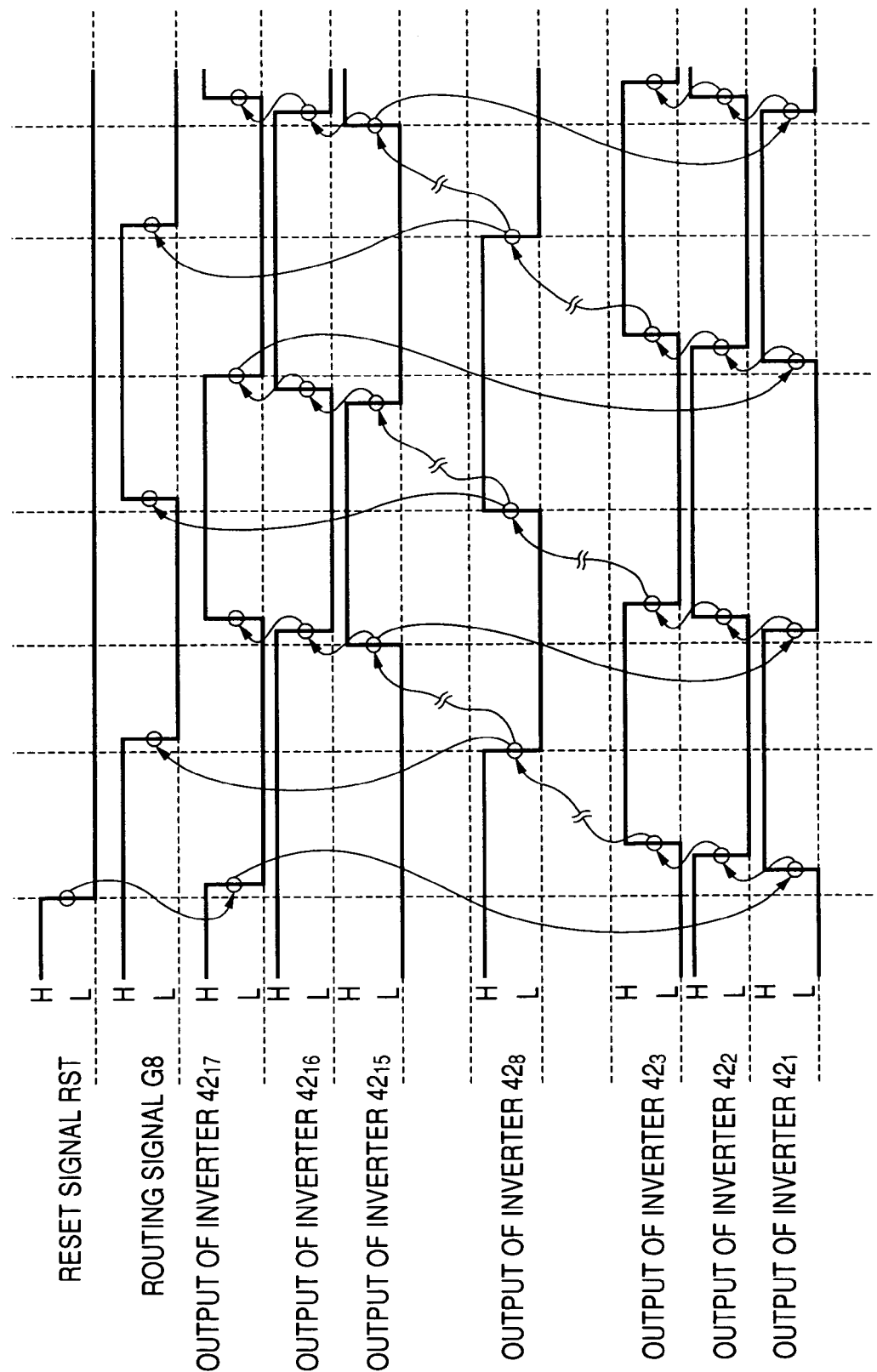
FIG. 6 is a time chart showing a change in a level of a pulse signal in elements of the pulse transit unit shown in FIG. 5.

FIG. 5 is a block diagram of a pulse transit unit of an A/D converter according to a third embodiment, and FIG. 6 is a time chart showing a level change in the pulse signal in elements of the pulse transit unit shown in FIG. 5.

As shown in FIG. 5, an A/D converter differs from that shown in FIG. 2 in that a pulse transit unit 51 is disposed in place of the unit 21. In the unit 51, seventeen inverters 42 ($42_1$ to $42_{17}$) representing inverting elements are serially arranged in a ring shape, and seventeen analog switches 43 ($43_1$ to $43_{17}$) are disposed so as to alternately place the inverters 42 and switches 43. Each switch $43_i$ connects an output of the inverter $42_{i-1}$ and an input of the inverter $42_i$. The switch $43_{17}$ connects to an output of the inverter $42_{16}$ and an input of the inverter $42_1$.

Further, the unit 51 has an inverter $42_{15\text{-}2}$ representing a sub-inverting element, a bypass analog switch $43_{1\text{-}2}$, an analog switch $43_{17\text{-}2}$, an inverter $42_{8\text{-}2}$ representing a sub-inverting element, an NOR gate 44 and an inverter 45. An input of the inverter $42_{15\text{-}2}$ is connected with an input of the inverter $42_{15}$ and the switch $43_{15}$, and the analog switch $43_{1\text{-}2}$ connects an input of the inverter $42_1$ and an output of the inverter $42_{15\text{-}2}$. An input of the inverter $42_{17}$ is grounded through the switch $43_{17\text{-}2}$. Moreover, an input of the inverter $42_{8\text{-}2}$ is connected with an input of the inverter $42_8$ and the switch $43_8$, a first input terminal of the NOR gate 44 is connected with an output of the inverter $42_{8\text{-}2}$, and an input of the inverter 45 is connected with an output of the NOR gate 44. The NOR gate 44 receives an inverted reset signal RST-bar at its second input terminal from the unit 22 shown in FIG. 2. The NOR gate 44 outputs an inverted routing signal G8-bar, and the inverter 45 outputs a routing signal G8. The switch $43_1$ is set at an open state in response to the routing signal G8 set at high level, and the switch $43_{1\text{-}2}$ is set at an open state in response to the inverted routing signal G8-bar set at high level. The switch $43_{17}$ is set at an open state in response to the inverted reset signal RST-bar set at high level, and the switch $43_{17\text{-}2}$ is set at an open state in response to a reset signal RST set at high level. The reset signal RST is output from the unit 22, and the inverted reset signal RST-bar is obtained by inverting the reset signal RST. The other switches $43_2$ to $43_{16}$ are always set at an open state.

Each of the inverters $42_1$ to $42_{17}$, $42_{8\text{-}2}$ and $42_{15\text{-}2}$ receives the analog voltage signal Vin as a power source voltage, in the same manner as in the first embodiment.

As shown in FIG. 6, when the reset signal RST is set in high level, the switch $43_{17}$ stand close, and the switch $43_{17\text{-}2}$ stand open. Further, the routing signal G8 is always set at high level, and the inverted routing signal G8-bar is always set at low level. In this case, the switch $43_1$ stand open, and the switch $43_{1\text{-}2}$ stand close. Because the switches $43_{17}$ and $43_{1\text{-}2}$ are closed, a first signal circulation path including the inverters $42_1$ to $42_{17}$ and switches $43_1$ to $43_{17}$ is disconnected, and a second signal circulation path including the inverters $42_1$ to $42_{14}$ and $42_{15\text{-}2}$ and switches $43_{1\text{-}2}$ and $43_2$ to $43_{15}$ is disconnected. Therefore, no pulse signal is transmitted in the unit 51.

When the reset signal RST is set at low level, the switch $43_{17}$ is opened in response to the signal RST-bar set at high level, and the switch $43_{17\text{-}2}$ is closed. Further, because the routing signal G8 remains at high level for a predetermined time, the switch $43_1$ maintains an open state. Therefore, after the inverter $42_{17}$ performs an inversion operation, the inverters $42_1$ to $42_{15}$ perform the inversion operation in that order. That is, the inverter $42_{17}$ acts as a starting inverting element.

For example, when the inverter $42_{17}$ changes its input signal to a low level in response to the signal RST-bar set at high level, an output signal of the inverter $42_{8\text{-}2}$ is changed to a low level. In response to this output signal of the inverter $42_{8\text{-}2}$, the routing signal G8 is changed to a low level, the switch $43_1$ is closed, and the switch $43_{1\text{-}2}$ is opened. Therefore, after the inversion operation of the inverters $42_1$ to $42_{15}$ in the second signal circulation path, a pulse signal is again circulated in the second signal circulation path. During the second circulation, an output signal of the inverter $42_{8\text{-}2}$ is changed to a high level, so that the routing signal G8 is changed to a high level. In response to the signal G8 set at a high level, the switch $43_1$ is opened, and the switch $43_{1\text{-}2}$ is closed. In this case, the second signal circulation path is disconnected or opened, and the first signal circulation path is closed. Therefore, the pulse signal circulated twice in the second signal circulation path changes its transmission path to the first signal circulation path.

Thereafter, after the single circulation of the pulse signal in the first signal circulation path, an output signal of the inverter $42_{8\text{-}2}$ is changed to a low level, so that the pulse signal changes its transmission path to the second signal circulation path and is twice circulated in the second signal circulation path, in the same manner.

The counter 12 shown in FIG. 2 increments a counting number each time an output signal of the inverter $42_{17}$ is changed to a low level. This counting number denotes the number of circulations of the pulse signal in the first signal circulation path. The number of inverters 42 through which the pulse signal is transmitted in each circulation counted in the counter 12 is equal to a sum Ns (Ns=32) of the total number Nt (Nt=17) of inverters 42 and the number Np (Np=15) of inverters 42 in the second signal circulation path. Further, when the selector 16 shown in FIG. 2 detects that a level of the output signal of the inverter $42_{15}$ is low, the selector 16 judges that the pulse signal is under first circulation in the second signal circulation path. In contrast, when the selector 16 detects that a level of the output signal of the inverter $42_{15}$ is high, the selector 16 judges that the pulse signal is under second circulation in the second signal circulation path. Therefore, when receiving the reset signal RST set at high level from the control unit 22 in place of the control signal PB, the selector 16 can detects the number of inverters 42, through which the pulse signal is transmitted after the last circulation in the first signal circulation path, within the sampling time Ts.

Therefore, because the inverters 42 and the analog switches 43 are alternately disposed, the transmission of the pulse signal is inevitably delayed by the analog switches 43. Accordingly, arrangement of elements and shape of wires in the unit 51 can be easily designed.

Further, because the pulse signal is twice circulated in a path including the inverters $42_1$ to $42_{14}$ and $42_{15\text{-}2}$ and switches $43_{1\text{-}2}$ and $43_2$ to $43_{15}$ each time the pulse signal is circulated in a path including the inverters $42_1$ to $42_{17}$ and switches $43_1$ to $43_{17}$, this A/D converter can act as a converter having inverters of which the number is higher than the number of inverters actually disposed. That is, the number of inverters in the unit 51 can be almost halved as compared with in the converters shown in FIG. 2 and FIG. 3. Accordingly, because resolution in the converter is heightened as the number of inverters in the unit 51 is increased, the A/D converter can be manufactured in a smaller size so as to satisfy resolution required in the converter.

Further, to further delay the transmission of the pulse signal in the unit 51, it is preferable to lengthen a gate of one of transistors of each analog switch 43 or to lengthen a gate of each transistor of the analog switches 43, or it is preferable to enlarge an area or volume of a gate of one of transistors of each analog switch 43 or to enlarge an area or volume of a gate of each transistor of the analog switches 43.

In this embodiment, the number of inverters $42_1$ to $42_{17}$ is set at seventeen. However, the number of inverters may be appropriately set at an odd number by performing actual experiments or simulations while considering the sampling time Ts and resolution required in an A/D converter.

Further, the inverter $42_{15\text{-}2}$ is disposed to form the second signal circulation path such that the number of inverters serially connected with one another in the path becomes an odd number and becomes highest among values lower than seventeen. However, the number of inverters in the path may be set at an arbitrary odd number lower than fifteen and higher than one. Moreover, the inverter $42_{8\text{-}2}$ is disposed almost in the middle position between the inverters $42_1$ and $42_{15}$ to obtain the routing signals G8 and G8-bar. However, an inverter for the routing signals may be disposed at an arbitrary position between the inverters $42_1$ and $42_{15}$.

In this embodiment, the inverter $42_{15\text{-}2}$ is disposed to form the second signal circulation path. However, the inverter $42_{15\text{-}2}$ is not required when an output of the inverter $42_{15}$ is connected with the switch $43_{1\text{-}2}$ in addition to the switch $43_{16}$.

Embodiment 4

Figure 7:
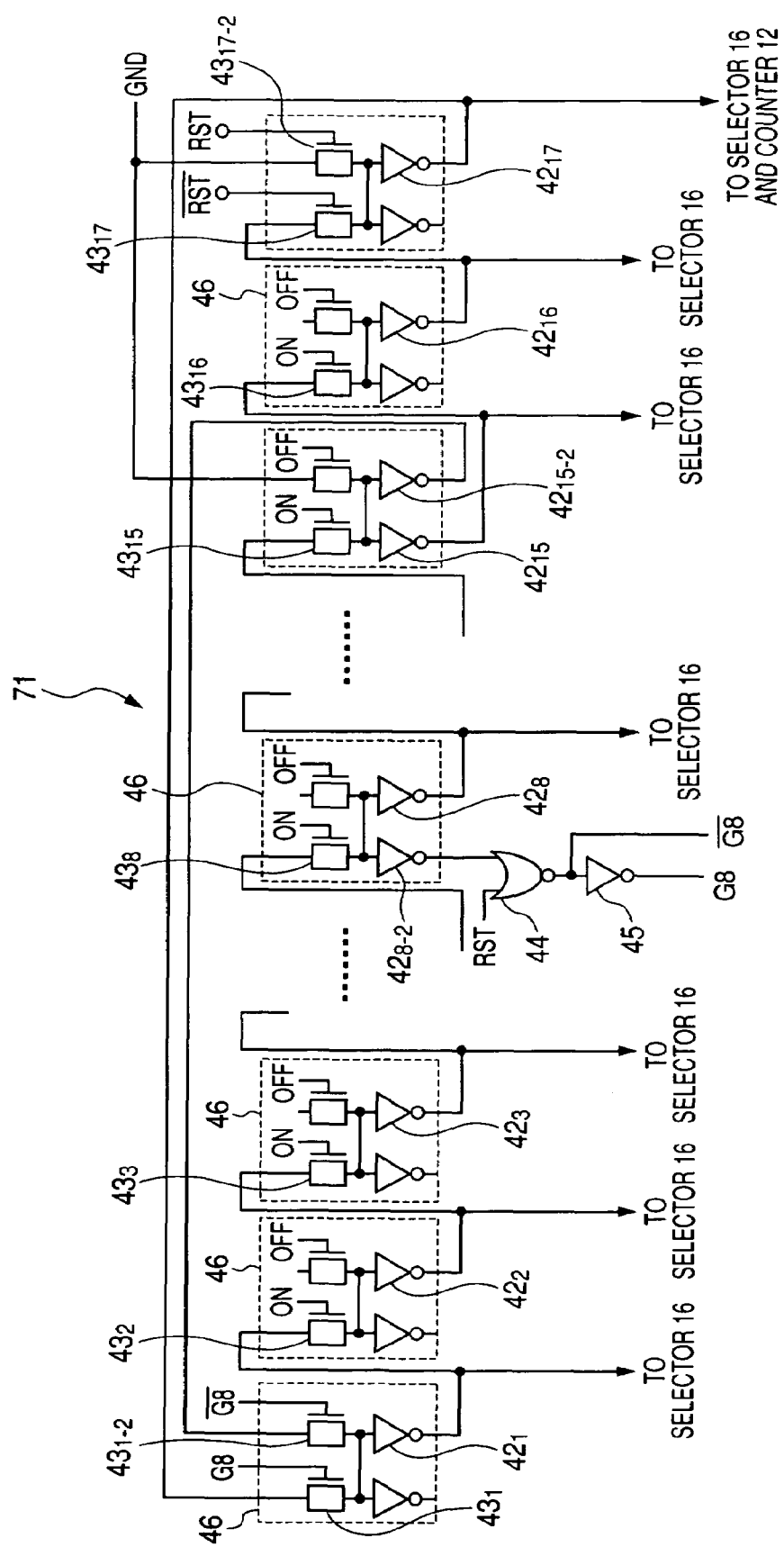
FIG. 7 is a block diagram of a pulse transit unit of an A/D converter according to a fourth embodiment of the present invention.

FIG. 7 is a block diagram of a pulse transit unit of an A/D converter according to a fourth embodiment.

As shown in FIG. 7, an A/D converter differs from that shown in FIG. 2 in that a pulse transit unit 71 is disposed in place of the unit 21. The unit 71 has seventeenth unit circuits 46 serially connected with one another in a ring shape, in addition to the NOR gate 44 and inverter 45. Each unit 226 has two inverters 42 ($42_k$ and $42_{k-2}$) ("k" is a natural number from 1 to seventeen) and two analog switches 43 ($43_k$ and $43_{k-2}$), respectively, connected with inputs of the inverters $42_k$ and $42_{k-2}$. The connection of the inverters 42, switches 43, NOR gate 44 and inverter 45 and the reception of control signals in the switches 43 and NOR gate 44 are set such that the unit 71 is operated in the same manner as the unit 51 shown in FIG. 5. Therefore, there are inverters and switches not used. An output of each inverter not used is connected with no element, and each switch not used is always set in an off state.

Because the unit 71 is operated in the same manner as the unit 51, the same effects as those in the converter having the unit 51 can obtained in the converter having the unit 71. Further, because the unit 71 is made by using the unit circuits 46 having the same configuration with one another, the unit 71 can be easily assembled. Accordingly, the arrangement of elements and shape of wires in the A/D converter can be further easily designed so as to correctly convert an analog voltage signal into a digital value.

What is claimed is:

1. An analog to digital converter, comprising:
   a pulse transit unit having a plurality of inverting elements serially connected with one another, each inverting element receiving an analog voltage signal as a power source voltage and converting a pulse signal in an inversion operation time, the inversion operation time being changeable in dependent on the analog voltage signal, the inverting elements including a starting inverting element from which the transmission of the pulse signal is started,
   a detecting unit which detects a transit position of the pulse signal in the pulse transit unit; and
   a control unit which controls the pulse transit unit to start the transmission of the pulse signal from the starting inverting element at a start time, controls the detecting unit to detect the transit position of the pulse signal at a detection time later than the start time by a predetermined time, calculates a digital value indicating a level of the analog voltage signal from the detected transit position of the pulse signal, and outputs the digital value,
   wherein the pulse transit unit further has a plurality of delay elements so as to alternately dispose the inverting elements and the delay elements to delay the transmission of the pulse signal.

2. The converter according to claim 1, wherein each delay element has a low pass filter including a resistor and a capacitor.

3. The converter according to claim 2, wherein the resistor of each delay element is formed of a wire connecting the inverting elements with each other.

4. The converter according to claim 2, wherein the capacitor of each delay element is formed between wires each connecting the inverting elements with each other.

5. The converter according to claim 1, wherein each delay element has an analog switch.

6. The converter according to claim 5, wherein each analog switch has a transistor, and a gate of each transistor is lengthened.

7. The converter according to claim 5, wherein each analog switch has a transistor, and a volume of a gate of each transistor is enlarged.

8. The converter according to claim 1, wherein each delay element has an even number of inverters serially connected with one another.

9. The converter according to claim 8, wherein each inverter has a transistor, and a gate of each transistor is lengthened.

10. The converter according to claim 8, wherein each inverter has a P-channel transistor and an N-channel transistor, and a gate of each transistor is lengthened.

11. The converter according to claim 8, wherein each inverter has a transistor, and a volume of a gate of each transistor is enlarged.

12. The converter according to claim 8, wherein each inverter has a P-channel transistor and an N-channel transistor, and a volume of a gate of each transistor is enlarged.

13. The converter according to claim 1, wherein the digital value is expressed by binary digits.

14. An analog to digital converter, comprising:
   a pulse transit unit having a plurality of inverting elements serially connected with one another, each inverting element receiving an analog voltage signal as a power source voltage and converting a pulse signal in an inversion operation time, the inversion operation time being changeable in dependent on the analog voltage signal, the inverting elements including a starting inverting element from which the transmission of the pulse signal is started,
   a detecting unit which detects a transit position of the pulse signal in the pulse transit unit; and
   a control unit which controls the pulse transit unit to start the transmission of the pulse signal from the starting inverting element at a start time, controls the detecting unit to detect the transit position of the pulse signal at a detection time later than the start time by a predetermined time, calculates a digital value indicating a level of the analog voltage signal from the detected transit position of the pulse signal, and outputs the digital value, wherein the pulse transit unit further has a plurality of analog switches so as to alternately dispose the inverting elements and the analog switches, and the control unit controls the analog switches such that the pulse signal is twice transmitted through a portion of the inverting elements and analog switches each time the pulse signal is transmitted through all the inverting elements and analog switches.

15. The converter according to claim 14, wherein each analog switch is configured to delay transmission of the pulse signal in the analog switch.

16. The converter according to claim 14, wherein each analog switch has a transistor, and a gate of each transistor is lengthened.

17. The converter according to claim 14, wherein each analog switch has a transistor, and a volume of a gate of each transistor is enlarged.

18. The converter according to claim 14, wherein the pulse transit unit further has a bypass analog switch on a signal line which serially connects the portion of the inverting elements and analog switches in a ring shape, and the control unit sets the by pass analogs witch at an on state to circulate the pulse signal through the portion of the inverting elements and analog switches.

19. The converter according to claim 18, wherein
the pulse transit unit is divided into a plurality of first unit circuits corresponding to the portion of the inverting elements and analog switches and a plurality of second unit circuits such that the pulse signal is twice transmitted through only the first unit circuits each time the pulse signal is transmitted through the second unit circuits,
each of the first and second unit circuits has one of the inverting elements, one of the analog switch directly connected with the inverting element, a sub-inverting element directly connected with the analog switch, and a sub-analog switch directly connected with the inverting element and sub-inverting element,
the sub-analog switch of a first specific unit circuit selected from the first unit circuits is used as the bypass analog switch,
the sub-inverting element of a second specific unit circuit selected from the first unit circuits is adapted to generate a routing signal and an inverted routing signal,
each of the analog switch and the sub-analog switch of the first specific unit circuit is set at an on state in response to the routing signal or the inverted routing signal such that the pulse signal is circulated through only the first unit circuits in response to the sub-analog switch set at an on state and is circulated through the first and second unit circuits in response to the analog switch set at an on state, and
the sub-inverting element of a third specific unit circuit selected from the first unit circuits is connected with the bypass analog switch to circulate the pulse signal through only the first unit circuits.

20. The converter according to claim 14, wherein the digital value is expressed by binary digits.

21. An analog to digital converter, comprising:
a pulse transit unit having a plurality of inverting elements serially connected with one another, each inverting element receiving an analog voltage signal as a power source voltage and converting a pulse signal in an inversion operation time, the inversion operation time being changeable in dependent on the analog voltage signal, the inverting elements including a starting inverting element from which the transmission of the pulse signal is started,
a detecting unit which detects a transit position of the pulse signal in the pulse transit unit; and
a control unit which controls the pulse transit unit to start the transmission of the pulse signal from the starting inverting element at a start time, controls the detecting unit to detect the transit position of the pulse signal at a detection time later than the start time by a predetermined time, calculates a digital value indicating a level of the analog voltage signal from the detected transit position of the pulse signal, and outputs the digital value,
wherein each inverting element of the pulse transit unit has a P-channel transistor and an N-channel transistor serially connected with one another, and at least one of the transistors of each inverting element is adapted to lower an operation speed of the transistor.

22. The converter according to claim 21, wherein a gate of the transistor of each inverting element is lengthened.

23. The converter according to claim 21, wherein a volume of a gate of each transistor of each inverting element is enlarged.

24. The converter according to claim 21, wherein the digital value is expressed by binary digits.

* * * * *